United States Patent
Okahara et al.

(10) Patent No.: US 6,707,275 B2
(45) Date of Patent: Mar. 16, 2004

(54) AUTOMATIVE GENERATOR CONTROL APPARATUS

(75) Inventors: Hideto Okahara, Kariya (JP); Fuyuki Maehara, Nagoya (JP); Toshinori Maruyama, Anjo (JP)

(73) Assignee: Denso Corporation, Kariya (JP)

( * ) Notice: Subject to any disclaimer, the term of this patent is extended or adjusted under 35 U.S.C. 154(b) by 190 days.

(21) Appl. No.: 09/940,797

(22) Filed: Aug. 29, 2001

(65) Prior Publication Data

US 2002/0027426 A1 Mar. 7, 2002

(30) Foreign Application Priority Data

Sep. 7, 2000 (JP) .................................. 2000-272222
Oct. 4, 2000 (JP) .................................. 2000-304725

(51) Int. Cl.$^7$ .......................... H02H 7/06; H02P 11/00; H02P 9/00
(52) U.S. Cl. ........................................... 322/24; 322/28
(58) Field of Search ..................................... 322/28, 24

(56) References Cited

U.S. PATENT DOCUMENTS

| | | | |
|---|---|---|---|
| 4,831,322 A | * | 5/1989 | Mashino et al. ............... 322/28 |
| 5,023,539 A | | 6/1991 | Miller et al. ................... 322/28 |
| 5,028,811 A | | 7/1991 | Le Roux et al. ............. 304/270 |
| 5,140,253 A | * | 8/1992 | Itoh ............................. 322/28 |
| 5,144,220 A | * | 9/1992 | Iwatani et al. ................. 322/28 |
| 5,210,480 A | * | 5/1993 | Iwatani et al. ................. 322/28 |
| 5,886,500 A | * | 3/1999 | Iwatani et al. ............... 320/104 |
| 5,936,440 A | * | 8/1999 | Asada et al. ................. 327/110 |

FOREIGN PATENT DOCUMENTS

| | | |
|---|---|---|
| DE | 196 55 180 C2 | 5/2001 |
| EP | 199 18 025 A1 | 11/2000 |
| JP | 64-020000 | 1/1989 |
| JP | 04-096696 | 3/1992 |

* cited by examiner

Primary Examiner—Tran Nguyen
Assistant Examiner—Julio C. Gonzalez
(74) Attorney, Agent, or Firm—Oliff & Berridge, PLC

(57) ABSTRACT

A voltage regulator of an automotive generator has a MOS transistor, flywheel diode, voltage detection circuit, and booster circuit. When a battery terminal voltage is below a voltage adjustment setting, current is supplied by a current supply circuit separate from a charge pump circuit to raise a gate voltage of the MOS transistor until the source voltage of the MOS transistor becomes greater than the reverse bias voltage of the flywheel diode, and the charge pump circuit output is applied to the MOS transistor after this specified value is reached. The charge pump circuit has an even number of capacitor stages.

9 Claims, 2 Drawing Sheets

# AUTOMATIVE GENERATOR CONTROL APPARATUS

CROSS REFERENCE TO RELATED APPLICATION

This application is based on and incorporates herein by reference Japanese Patent Applications No. 2000-272222 filed on Sep. 7, 2000 and No. 2000-304725 filed on Oct. 4, 2000.

BACKGROUND OF THE INVENTION

The present invention relates to an automotive generator control apparatus for controlling an output voltage of an automotive generator by turning on and off a field coil current.

Automotive generators recharge a battery during vehicle engine operation in addition to providing power for engine ignition, vehicle lights, and other electrical equipment. A generator controller is connected to the generator for maintaining a substantially uniform output voltage even when the electrical load changes. Demand for reduced noise from the generator has increased with rising demand for higher automotive quality.

One method proposed to reduce generator noise is described in Japanese Patent Application Laid-open No. 64-20000, which teaches a method for reducing the switching noise signal that occurs when a field coil current is controlled by a MOS transistor. Switching noise signal is reduced with this method by negative feedback of a supply voltage from a voltage booster circuit to the gate terminal of the transistor so that the source voltage of the transistor follows a particular voltage step-up curve. The problem with this method is that the circuit design is complex and operation is likely to become unstable.

With another method proposed in Japanese Patent Application Laid-open No. 4-96696, when a transistor controlling a field coil current is conductive, current supply to the gate of the transistor is restricted until the source voltage of the transistor rises to a particular level. Thus, transistor conducting speed is slowed down to reduce switching noise signal. However, intermittent operation of a charge pump circuit used as a voltage booster circuit produces gate voltage current supply fluctuations, resulting in changes in, transistor current continuity. Conduction current change alone is a cause of switching noise signal. It is desirable to further reduce switching noise signal by suppressing this current change.

SUMMARY OF THE INVENTION

It is therefore an object of this invention to provide a control apparatus for a motor vehicle generator capable of reducing switching noise signal in a simple circuit configuration.

An automotive generator control apparatus according to the present invention has a switching device for interrupting current supply to a field coil of an automotive generator. A flywheel diode is parallel-connected to the field coil. A voltage detection circuit is provided for outputting a signal instruction to turn on or off the switching device so that the output voltage of the automotive generator is adjusted to a specified voltage. A drive circuit is provided for driving the switching device.

When a signal instructing the switching device to turn on is input from the voltage detection circuit, the drive circuit supplies a specific current to a switching device control terminal to raise the control terminal voltage until terminal voltage of the field coil exceed a specified value. After terminal voltage of the field coil rise to the specified value, the drive circuit applies a voltage higher than the output voltage of the automotive generator to the control terminal.

Because the switching device is driven by supplying the specific current until terminal voltage of the field coil rises to the particular value, change in current flow through the switching device is suppressed and switching noise signal in the output of the vehicle generator can be reduced. It will be noted that noise is reduced using a relatively simple circuit design because only elements for supplying the specific current are added to the circuit configuration generating a voltage higher than the output voltage of the automotive generator.

Alternatively, the drive circuit has a charge pump circuit having an even number of capacitor stages. A current supply circuit is provided for supplying current to the charge pump circuit. A signal circuit is provided for intermittently operating the charge pump circuit. A diode is connected in the forward direction from the input to the output terminal of the charge pump circuit.

The last capacitor in the charge pump circuit is charged when the first capacitor discharges, but the output current of the current supply circuit at this time is supplied to the control terminal of the switching device through the diode connected in the forward direction from the input terminal to the output terminal of the charge pump circuit. By supplying the output current of the current supply circuit to the control terminal of the switching device when the output current of the charge pump circuit is not supplied, change in the switching device drive current can be suppressed, change in current flow through the switching device can also be suppressed, and switching noise signal in the automotive generator output can be reduced. Furthermore, this can be achieved using a relatively simple circuit design because only the diode is added in parallel with the charge pump circuit.

BRIEF DESCRIPTION OF THE DRAWINGS

Other objects, features and advantages of the present invention will become more apparent from the following detailed description made with reference to the accompanying drawings.

In the drawings.

DETAILED DESCRIPTION OF THE PREFERRED EMBODIMENT (First Embodiment)

Figure 1:
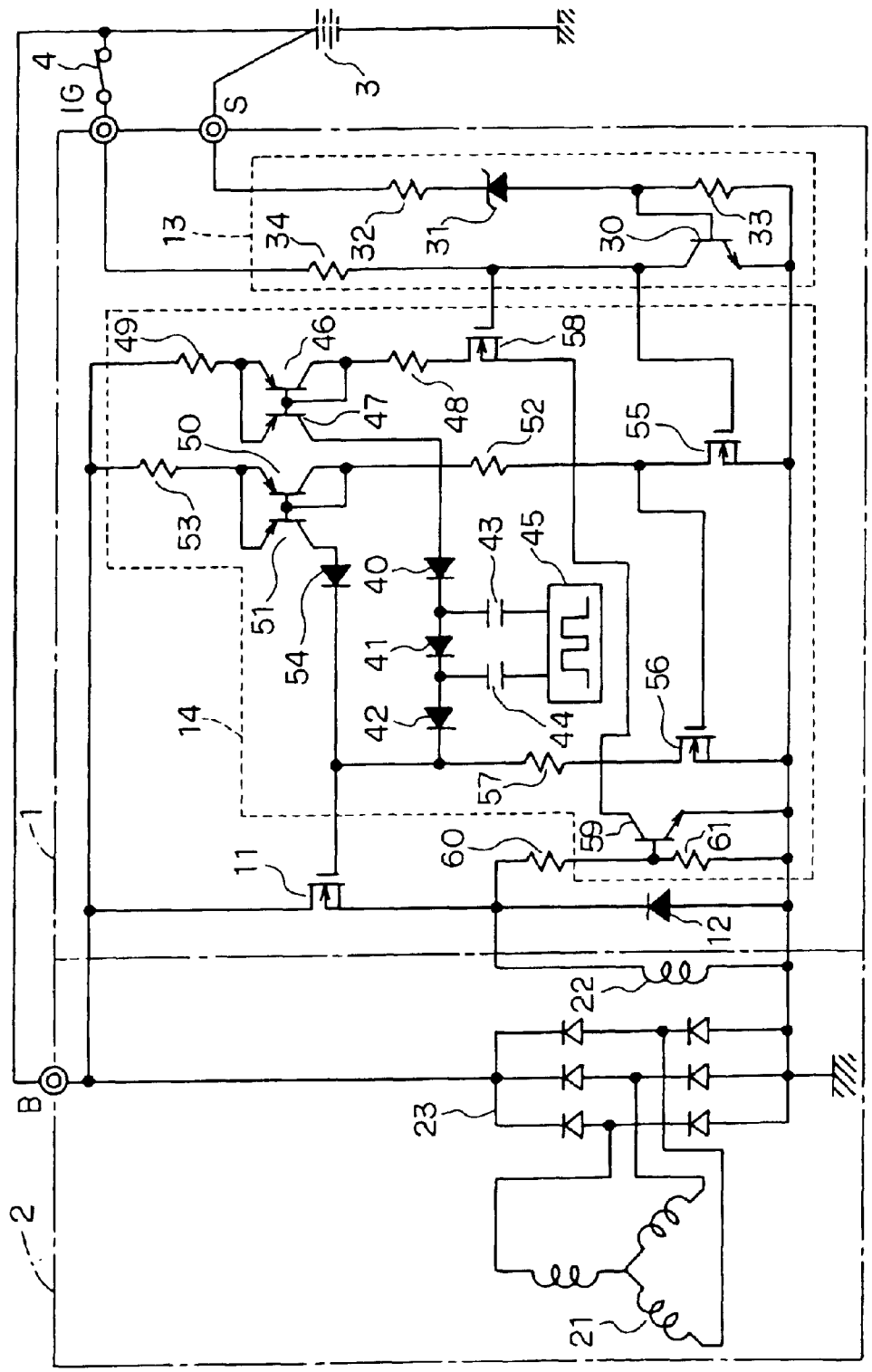
FIG. 1 is a circuit diagram of an automotive generator control apparatus according to a first embodiment of the present invention.

Referring to FIG. 1, a voltage regulator 1 is provided to control a voltage of the S-terminal, which is provided for detecting the voltage applied to a battery 3, to a particular voltage adjustment setting (such as 14v). An ignition detection terminal (IG terminal) is connected to the battery 3 through an ignition switch 4. Control by the regulator 1 starts when the ignition switch 4 is turned on (ON position).

A vehicle-mounted a.c. generator 2 includes a three-phase stator coils 21 wound on a stator, a rectifier circuit 23 for full-wave rectifying the three-phase output of the stator coils 21, and a field coil 22 wound on a rotor. The output voltage of the generator 2 is controlled by the regulator 1 by appropriately turning on and off current supply to the field coil 22. An output terminal (B terminal) of the generator 2 is connected to the battery 3, so that a charging current is supplied from the terminal B to the battery 3.

The regulator 1 has a MOS transistor 11 connected in series with the field coil 22, a flywheel diode 12 parallel-connected to the field coil 22, a voltage detection circuit 13, and a voltage booster circuit 14. The voltage detection circuit 13 determines whether the MOS transistor 11 conducts or turns on so that the S terminal voltage, which varies with the output voltage of the generator 2, is held at a specified voltage adjustment setting. The booster circuit 14 is disposed between the voltage detection circuit 13 and MOS transistor 11 to operate as a drive circuit for driving the MOS transistor 11.

The voltage detection circuit 13 comprises a transistor 30, a Zener diode 31, and three resistors 32, 33, 34. The Zener diode 31 is selected so that it turns on when the S terminal voltage exceeds the voltage adjustment setting, thus causing the transistor 30 to conduct and the collector potential to drop. The collector of transistor 30 is connected to the booster circuit 14. A low potential signal output from the collector is a control signal instructing the booster circuit 14 to interrupt or turn off the MOS transistor 11. Conversely, when the S terminal voltage is less than or equal to the voltage adjustment setting, the base potential of the transistor 30 drops, interrupting the transistor 30 and raising the collector potential. This high potential signal output from the collector of the transistor is a control signal instructing the booster circuit 14 to turn on the MOS transistor 11.

The booster circuit 14 includes a charge pump circuit, which comprises three diodes 40, 41, 42 and two capacitors 43, 44. In addition, a signal circuit 45 is provided for intermittently driving the charge pump circuit. Two transistors 50, 51, two resistors 52, 53, and diode 54 are provided to operate as a first current supply circuit for supplying a specific current to the gate terminal of the MOS transistor 11. Two transistors 46, 47 and two resistors 48, 49 are operated as a second current supply circuit for supplying current to the charge pump circuit. Two transistors 55, 56, and resistor 57 are provided to operate to interrupt continuity to the MOS transistor 11 in response to an appropriate interrupt signal input from the voltage detection circuit 13. Two transistors 58, 59 and two resistors 60, 61 are provided for operating the second current supply circuit when terminal voltage (the MOS transistor 11 source potential) of the field coil 22 exceeds a particular level.

The first embodiment operates as follows.

(A)

When the S terminal voltage is greater than or equal to the voltage adjustment setting, the Zener diode 31 turns on and transistor 30 conducts, thus interrupting transistor 58 of booster circuit 14. The boosting operation of the charge pump circuit thus stops because current is not supplied by the current mirror circuit comprising transistors 46, 47. Furthermore, because transistor 55 does not conduct either, current is not supplied to the gate of MOS transistor 11 by the current mirror circuit comprising transistors 50 and 51.

In this instance, transistor 56 conducts. As a result, the gate voltage of MOS transistor 11 drops and MOS transistor 11 turns on. Because the field coil 22 has a large inductance component, the current flowing through field coil 22 at this time flows through flywheel diode 12 and gradually drops.

(B)

When the S terminal voltage is less than the voltage adjustment setting, transistor 30 turns on and transistor 55 conducts. This transistor 55 pulls a specific current through resistor 52, and this current is supplied to diode 54 by the transistors 50, 51 forming a current mirror circuit. The current output from diode 54 then causes the gate terminal voltage of the MOS transistor 11 to rise, MOS transistor 11 gradually conducts, and the source voltage of the MOS transistor 11 rises.

This source voltage is a voltage divided by resistors 60, 61. When the divided voltage (terminal voltage of resistor 61) reaches a particular level, transistor 59 conducts. In conjunction therewith, transistor 58 also conducts. A specified current is pulled through resistor 48. This current is supplied to the first diode 40 in the charge pump circuit by transistors 46, 47 of the current mirror circuit.

The signal circuit 45 is also connected to capacitors 43, 44, to which it applies opposite phase signal voltages. The other terminal of capacitor 43 is connected to the cathode of the first stage diode 40 and the anode of the second stage diode 41. The other terminal of the other capacitor 44 is connected to the cathode of the second stage capacitor 41 and the anode of the third stage capacitor 42. The cathode of the third stage capacitor 42 is the output terminal of the charge pump circuit, and is connected to the cathode of diode 54 and the gate of MOS transistor 11. This means that when the current is supplied to the first stage diode 40 when the signal circuit 45 is operating, mutually opposite phase voltages are applied to capacitors 43, 44, and a voltage higher than the output voltage of the generator 2 can be produced from the output terminal of the charge pump circuit.

It should be noted that while the regulator 1 uses two sets of diodes and capacitors in the charge pump circuit, the actual number of sets can be varied as needed.

When the S terminal voltage drops below the voltage adjustment setting, it is thus possible to suppress change in the current flowing between the source and drain of the MOS transistor 11 by supplying current using the current supply circuit separate from the charge pump circuit and thereby boost the gate voltage of the MOS transistor 11 until the source voltage of the MOS transistor 11 (that is, terminal voltage of the field coil 22) reach a voltage exceeding the inverse bias voltage of the flywheel diode 12. It is therefore possible to reduce switching noise signal contained in the output voltage of the generator 2. Furthermore, after the source voltage of the MOS transistor 11 reaches the specific level, the drive voltage is produced by the charge pump circuit and applied to the gate of the MOS transistor 11. However, because the current flowing between the source and drain of the MOS transistor 11 flows to the field coil 22 at this time, fluctuation in the voltage applied to the gate of the MOS transistor 11 is smoothed by the inductance component of the field coil 22. Thus, switching noise signal is reduced.

The MOS transistor 11 can alternatively be connected to the low potential side. Furthermore, a MOS transistor 11 is used as the switching device, but it will be obvious that a bipolar transistor and other types of devices can be used for the switching device.

(Second Embodiment)

Figure 2:
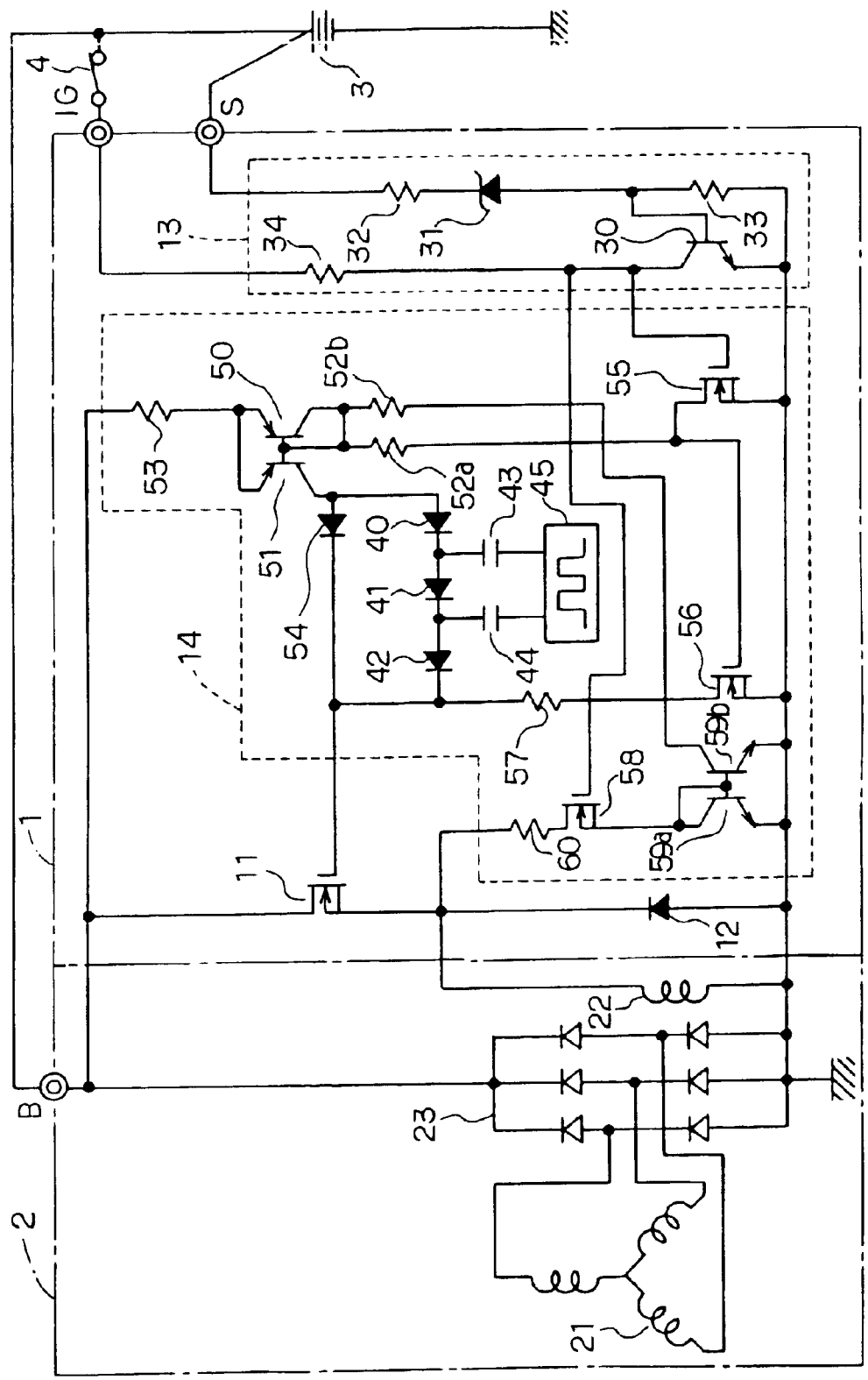
FIG. 2 is a circuit diagram of an automotive generator control apparatus according to a second embodiment of the present invention.

In a second embodiment shown in FIG. 2, a booster circuit 14 differs from the booster circuit 14 in the first embodiment.

More specifically, this booster circuit 14 comprises a charge pump circuit comprising three diodes 40, 41, 41 and two capacitors 43, 44. A signal circuit 45 is provided for intermittently driving the charge pump circuit. Two transistors 50, 51 and three resistors 52a, 52b, and 53 are provided to operate as a current supply circuit for supplying current to the charge pump circuit. A diode 54 is connected in parallel with the charge pump circuit. Two transistors 55 and 56 are provided to operate to turn on the MOS transistor 11 according to an interrupt control signal input from the voltage detection circuit 13. Transistors 58, 59a, 59b and resistor 60 are provided for setting the supply current of the current supply circuit according to the source voltage of the MOS transistor 11.

The second embodiment operates as follows.

(A)

When the S terminal voltage is greater than or equal to the voltage adjustment setting, Zener diode 31 turns on and transistor 30 conducts, thus interrupting transistor 55 of booster circuit 14. The boosting operation of the charge pump circuit and current supply through diode 54 thus stop, because current is not supplied by the current mirror circuit comprising transistors 47, 50. Current is therefore also not supplied to the gate of MOS transistor 11.

In this case transistor 56 conducts. The gate voltage of MOS transistor 11 drops and MOS transistor 11 turns on. Because the field coil 22 has a large inductance component, the current flowing through field coil 22 at this time flows through flywheel diode 12 and gradually drops.

(B)

When the S terminal voltage is less than the voltage adjustment setting, transistor 30 turning off and transistor 55 conducts. This transistor 55 pulls a specific current through resistor 52a. This current is supplied to first stage diode 40 of the charge pump circuit by the transistors 50, 51 forming a current mirror circuit and to the diode 54 connected between the input and output terminals of the charge pump circuit, and the gate voltage of the MOS transistor 11 rises.

The signal circuit 45 is also connected to capacitors 43, 44, to which it applies opposite phase signal voltages. The other terminal of capacitor 43 is connected to the cathode of the first stage diode 40, to the anode of which is connected an input terminal, and the anode of the second stage diode 41. The other terminal of the other capacitor 44 is connected to the cathode of the second stage diode 41 and the anode of the third stage diode 42. The cathode of the third stage diode 42 is the output terminal of the charge pump circuit, and is connected to the cathode of diode 54 and the gate of MOS transistor 11. This means that when current is supplied to the first stage diode 40 when the signal circuit 45 is operating, mutually opposite phase voltages are applied to capacitors 43, 44, and a voltage higher than the output voltage of the generator 2 can be produced from the output terminal of the charge pump circuit.

It should be noted that because the charge pump circuit of this embodiment has an even number of capacitor stages (two), the last capacitor 44 is in a discharge state when the first capacitor 43 is charging, and this discharge current is supplied to the gate of the MOS transistor 11. In addition, because the last capacitor 44 charges when the first capacitor 43 discharges, current is not supplied from the pump to the gate of the MOS transistor 11, but the current supplied to the input terminal of the charge pump circuit at this timing is supplied through diode 54 to the gate of the MOS transistor 11.

Furthermore, when the current is thus supplied to the gate of MOS transistor 11 and the current flowing between the source and drain of the MOS transistor 11 rises until the flywheel diode 12 can be reverse-biased, the source voltage of the MOS transistor 11 begins to rise. On the other hand, because the source of MOS transistor 11 is connected to one transistor 59a of the current mirror circuit via resistor 60 and transistor 58, the current flowing through transistor 59a of the current mirror circuit rises in conjunction with the rise in the source voltage of the MOS transistor 11 when the S terminal voltage becomes less than the voltage adjustment setting, transistor 30 turns on, and transistor 58 conducts. The current flowing from the other transistor 59b through resistor 52b to transistor 50 thus increases, and the drive current generated by the current supply circuit, which is formed by the current mirror circuit including this transistor 50, rises.

By thus using an even number of capacitor stages in the charge pump circuit and parallel-connected diode 54 in the forward direction from the input to the output terminal of the charge pump circuit, the current supplied from the current supply circuit to the input terminal is supplied through diode 54 to the gate of MOS transistor 11 when the last capacitor 44 of the charge pump circuit is charging and the drive voltage (drive current supply) is not applied to the gate of the MOS transistor 11 from the charge pump circuit. It is therefore possible to smoothen the rise in the gate voltage of the MOS transistor 11 when the S terminal voltage is less than the voltage adjustment setting, and suppress change in current flow to the MOS transistor 11. It is therefore possible to reduce switching noise signal in the output voltage of the generator 2.

Furthermore, by increasing current supply to the charge pump circuit and diode 54 after the source voltage of the MOS transistor 11 rises to the specified level (the reverse bias voltage of the flywheel diode 12), the gate voltage of the MOS transistor 11 can be quickly boosted and loss in the MOS transistor 11 can be reduced. Moreover, because current flow between the source and drain of MOS transistor 11 flows to the field coil 22 when the source voltage of the MOS transistor 11 is greater than the reverse bias voltage of the flywheel diode 12, fluctuation in the voltage applied to the gate of the MOS transistor 11 is smoothed by the inductance component of the field coil 22 and switching noise signal is suppressed.

It will be obvious to one with ordinary skill in the related art that the present invention shall not be limited to the disclosed embodiments and can be varied in many ways without departing from the spirit of the invention. For instance, the MOS transistor 11 may alternatively be connected to the low potential side. Furthermore, the MOS transistor 11 may be replaced with bipolar transistor. Further and other types of devices can be used for the switching device.

What is claimed is:

1. A control apparatus for an automotive generator having a field coil, comprising:

a switching device for turning on and off current supply to the field coil of the automotive generator;

a flywheel diode connected in parallel with the field coil;

a voltage detection circuit for outputting an instruction signal to turn on and off the switching device so that an output voltage of the automotive generator is regulated to a specified adjusted voltage; and a drive circuit for driving the switching device, when the instruction signal instructing the switching device to turn on is input from the voltage detection circuit, by only flowing a specific current to a control terminal of the switching device to raise a control terminal voltage until a terminal voltage of the field coil exceeds a specified value and applying a voltage higher than the output voltage of the automotive generator to the control terminal after the terminal voltage of the field coil exceeds the specified value.

2. The control apparatus as in claim 1, wherein the specified value compared with the terminal voltage of the field coil is greater than a reverse bias voltage of the flywheel diode.

3. The control apparatus as in claim 1, wherein the switching device is a MOS transistor having a gate terminal as the control terminal.

4. The control apparatus as in claim 3, wherein the drive circuit includes:
- a first current supply circuit for supplying the specific current to the gate terminal of the MOS transistor;
- a charge pump circuit;
- a second current supply circuit for supplying a current to the charge pump circuit; and
- a signal circuit for intermittently operating the charge pump circuit,
- wherein, when a conduction instruction signal is input from the voltage detection circuit, the drive circuit supplies the specific current from the first current supply circuit to the gate terminal until the terminal voltage of the field coil exceeds the specified value, and supplies an output voltage of the charge pump circuit to the gate terminal after the terminal voltage of the field coil exceeds the specified value.

5. A control apparatus for an automotive generator having a field coil comprising:
- a switching device for turning on and off current supply to the field coil of the automotive generator;
- a flywheel diode connected in parallel with the field coil;
- a voltage detection circuit for outputting an instruction signal to turn on and off the switching device so that an output voltage of the automotive generator is regulated to a specified adjusted voltage; and
- a drive circuit for driving the switching device, when the instruction signal instructing the switching device to turn on is input from the voltage detection circuit, by applying a voltage higher than the output voltage of the automotive generator to a control terminal of the switching device,
- wherein the drive circuit includes a charge pump circuit having an even number of capacitor stages, a current supply circuit for supplying a current to the charge pump circuit, a signal circuit for intermittently operating the charge pump circuit, and a diode connected in a forward direction from an input to output terminals of the charge pump circuit.

6. The control apparatus as in claim 5, wherein the switching device is a MOS transistor having a gate terminal as the control terminal.

7. The control apparatus as in claim 6, wherein the MOS transistor has a source voltage connected to the field coil; and
- the current supply circuit sets the current according to the source voltage of the MOS transistor.

8. A control apparatus for an automotive generator having a field coil, comprising:
- a switching device for turning on and off current supply to the field coil of the automotive generator;
- a flywheel diode connected in parallel with the field coil;
- a voltage detection circuit for outputting an instruction signal to turn on and off the switching device so that an output voltage of the automotive generator is regulated to a specified adjusted voltage; and
- a drive circuit for driving the switching device, when the instruction signal instructing the switching device to turn on is input from the voltage detection circuit, by only flowing a specific current to a control terminal of the switching device to raise a control terminal voltage until a terminal voltage of the field coil exceeds a specified value and applying a voltage higher than the output voltage of the automotive generator to the control terminal after the terminal voltage of the field coil exceeds the specified value, wherein the specific value compared with the terminal voltage of the field coil is greater than a reverse bias voltage of the flywheel diode.

9. A control apparatus for an automotive generator having a field coil, comprising:
- a switching device for turning on and off current supply to the field coil of the automotive generator;
- a flywheel diode connected in parallel with the field coil;
- a voltage detection circuit for outputting an instruction signal to turn on and off the switching device so that an output voltage of the automotive generator is regulated to a specified adjusted voltage; and
- a drive circuit for driving the switching device, when the instruction signal instructing the switching device to turn on is input from the voltage detection circuit, by only flowing a specific current to a control terminal of the switching device to raise a control terminal voltage until a terminal voltage of the field coil exceeds a specified value and applying a voltage higher than the output voltage of the automotive generator to the control terminal after the terminal voltage of the field coil exceeds the specified value, wherein the switching device is a MOS transistor having a gate terminal as the control terminal, and wherein the drive circuit includes:
- a first current supply circuit for supplying the specific current to the gate terminal of the MOS transistor;
- a charge pump circuit;
- a second current supply circuit for supplying a current to the charge pump circuit; and
- a signal circuit for intermittently operating the charge pump circuit,
- wherein, when a conduction instruction signal is input from the voltage detection circuit, the drive circuit supplies the specific current from the first current supply circuit to the gate terminal until the terminal voltage of the field coil exceeds the specified value, and supplies an output voltage of the charge pump circuit to the gate terminal after the terminal voltage of the field coil exceeds the specified value.

* * * * *